United States Patent
Hiramatsu (10) Patent No.: US 10,424,760 B2
(45) Date of Patent: Sep. 24, 2019

(54) DISPLAY DEVICE INCLUDING MIDDLE LAYER WITH VARIED NITROGEN CONTENT LOCATED BETWEEN FIRST AND SECOND BASES AND MANUFACTURING METHOD OF THE SAME

(71) Applicant: Japan Display Inc., Minato-ku (JP)

(72) Inventor: Masato Hiramatsu, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/981,936

(22) Filed: May 17, 2018

(65) Prior Publication Data
US 2018/0351131 A1  Dec. 6, 2018

(30) Foreign Application Priority Data

Jun. 6, 2017  (JP) .................................. 2017-111798

(51) Int. Cl.
| | |
|---|---|
| H01L 51/52 | (2006.01) |
| H01L 27/32 | (2006.01) |
| H01L 51/56 | (2006.01) |
| G09G 3/3208 | (2016.01) |
| H01L 51/00 | (2006.01) |

(52) U.S. Cl.
CPC ....... *H01L 51/5253* (2013.01); *G09G 3/3208* (2013.01); *H01L 27/3246* (2013.01); *H01L 51/0096* (2013.01); *H01L 51/0097* (2013.01); *H01L 51/5203* (2013.01); *H01L 51/5246* (2013.01); *H01L 51/5259* (2013.01); *H01L 51/56* (2013.01); *G02F 2201/121* (2013.01); *G02F 2201/123* (2013.01); *G09G 2300/0426* (2013.01); *H01L 51/003* (2013.01)

(58) Field of Classification Search
None
See application file for complete search history.

(56) References Cited

U.S. PATENT DOCUMENTS

| | | | | |
|---|---|---|---|---|
| 8,618,731 | B2 * | 12/2013 | Albrecht | H01L 25/046 313/504 |
| 9,666,599 | B2 | 5/2017 | Hiramatsu et al. | |
| 2003/0178937 | A1 * | 9/2003 | Mishima | H01L 51/52 313/511 |
| 2007/0222370 | A1 * | 9/2007 | Zhu | H01L 51/0097 313/504 |
| 2014/0353638 | A1 * | 12/2014 | Kawata | H01L 27/322 257/40 |

(Continued)

FOREIGN PATENT DOCUMENTS

JP  2015-088457  5/2015

OTHER PUBLICATIONS

'U-Varnish' downloaded from URL<https://www.ube.com/contents/en/chemical/polyimide/u-varnish.html> on Mar. 12, 2019. (Year: 2019).*

(Continued)

*Primary Examiner* — J. E. Schoenholtz
(74) *Attorney, Agent, or Firm* — Oblon, McClelland, Maier & Neustadt, L.L.P.

(57) ABSTRACT

According to one embodiment, a display device includes a first base, a second base, a middle layer including a metal layer located between the first base and the second base, and a circuit unit and a display element unit located above the second base.

17 Claims, 8 Drawing Sheets

(56) References Cited

U.S. PATENT DOCUMENTS

| | | |
|---|---|---|
| 2015/0115235 A1 | 4/2015 | Lee et al. |
| 2015/0200333 A1* | 7/2015 | Okumoto .............. H01L 51/003 257/79 |
| 2016/0260904 A1* | 9/2016 | Park ................... H01L 51/5253 |
| 2017/0317300 A1* | 11/2017 | Nishi ..................... B32B 15/08 |
| 2017/0374737 A1* | 12/2017 | Jeong .................... B32B 15/08 |

OTHER PUBLICATIONS

'A complete product line based on UBE U-Varnish Technology' downloaded from URL<http://www.upilex.jp/en/varnish.html> on Mar. 12, 2019. (Year: 2019).*

* cited by examiner

DISPLAY DEVICE INCLUDING MIDDLE LAYER WITH VARIED NITROGEN CONTENT LOCATED BETWEEN FIRST AND SECOND BASES AND MANUFACTURING METHOD OF THE SAME

CROSS-REFERENCE TO RELATED APPLICATIONS

This application is based upon and claims the benefit of priority from Japanese Patent Application No. 2017-111798, filed Jun. 6, 2017, the entire contents of which are incorporated herein by reference.

FIELD

Embodiments described herein relate generally to a display device and a manufacturing method of the same.

BACKGROUND

In recent years, attention has been focused on sheet displays. A sheet display comprises a base of a flexible material such as a polyimide film and has a characteristic of allowing a completed display element to be bent and the like. An organic electroluminescent (hereinafter simply called organic EL) element or the like is used as the display element in the sheet display.

An emitting layer included in the organic EL element is easily degraded by influence of moisture. The degradation of the emitting layer may be a reason for inconvenience such as reduction in the amount of light emission and unluminousness in the organic EL element. For this reason, a structure capable of preventing moisture from entering the organic EL element from the outside is important. For example, a technology of bonding a sealing layer formed of polyimide or the like on a heat-resistant flexible substrate formed of polyimide or the like has been proposed. The sealing layer prevents oxygen or moisture from entering from a lower portion of the flexible substrate.

Recently, influence of hydrogen atoms is considered. In particular, if a transistor which drives the organic EL element is a MOS transistor using low-temperature polycrystalline silicon, transistor characteristics may be varied and the display quality may be varied since hydrogen atoms diffuse to the channel layer and the gate insulating film.

DETAILED DESCRIPTION

In general, according to one embodiment, a display device includes a first base, a second base, a middle layer including a metal layer located between the first base and the second base, and a circuit unit and a display element unit located above the second base.

According to another embodiment, a method of manufacturing a display device, the method includes applying polyimide in a varnish state on a support substrate, baking polyimide, and forming a first base, forming a middle layer including a metal layer on the first base, applying polyimide in a varnish state on the middle layer, baking polyimide, and forming a second base, and forming a circuit unit and a display element unit on the second base.

Embodiments will be described hereinafter with reference to the accompanying drawings. The disclosure is a mere example, and arbitrary change of gist which can be easily conceived by a person of ordinary skill in the art naturally falls within the inventive scope. To more clarify the explanations, the drawings may pictorially show width, thickness, shape and the like of each portion as compared with actual embodiments, but they are mere examples and do not restrict the interpretation of the invention. Furthermore, in the description and Figures of the present application, structural elements having the same or similar functions will be referred to by the same reference numbers and detailed explanations of them that are considered redundant may be omitted.

Figure 1:
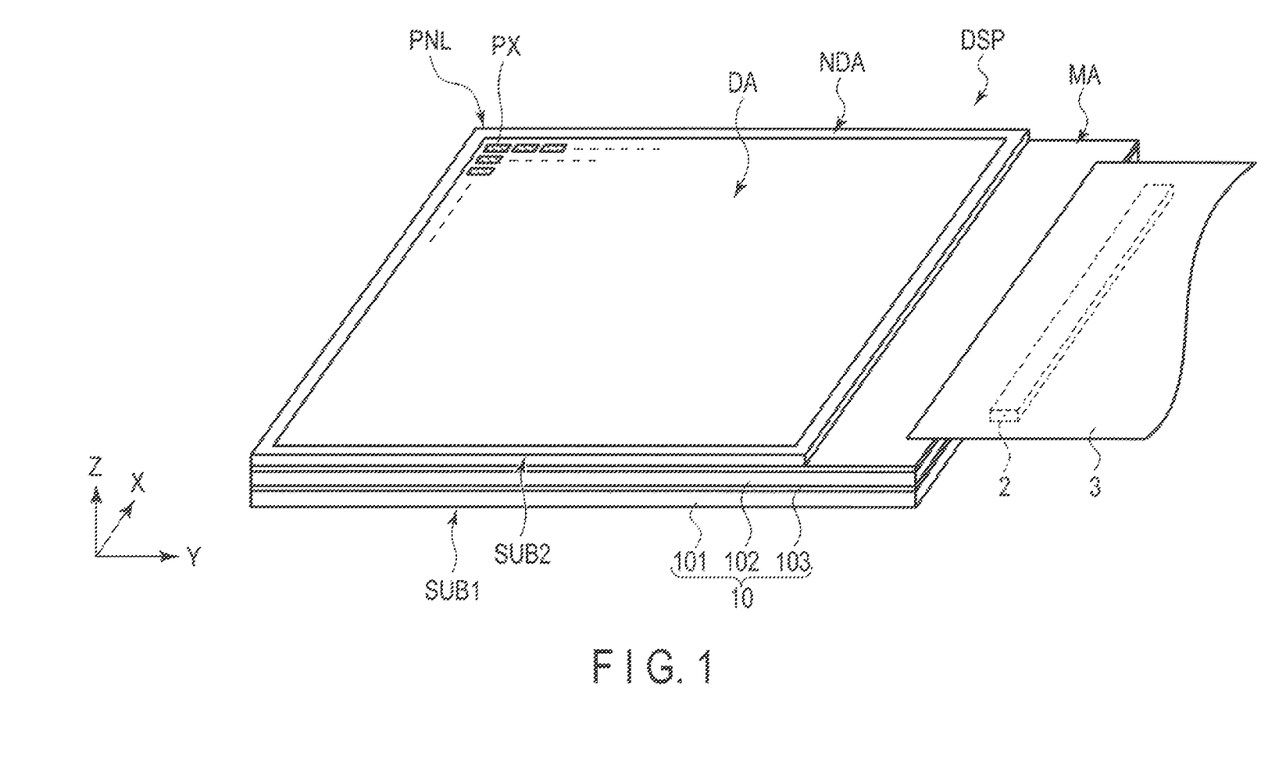
FIG. 1 is a perspective view showing an appearance of a display device DSP according to the embodiments.

FIG. 1 is a perspective view showing an appearance of a display device DSP according to the embodiments. A first direction X and a second direction Y intersect each other, and a third direction Z intersects the first direction X and the second direction Y. For example, the first direction X, the second direction Y, and the third direction Z are orthogonal to one another but may intersect at an angle other than ninety degrees. In the present specification, a position on a side of a tip of an arrow indicating the third direction Z is called an upper position and a position on a side of a rear end of the arrow indicating the third direction Z is called a lower position. According to "a second member on/above a first member" and "a second member under/below a first member", the second member may be in contact with the first member or may be remote from the first member. In addition, an observation position at which the display device DSP is observed is assumed to be located on the tip side of the arrow indicating the third direction Z, and viewing from the observation position toward the X-Y plane defined by the first direction X and the second direction Y is called a planar view.

In the embodiments, an organic EL display device will be explained as an example of the display device. The major configuration explained in the present embodiment can also be applied to a liquid crystal display device, an electronic paper display device comprising an electrophoretic element, and the like, a display device employing micro-electromechanical system (MEMS), or a display device employing electrochromism.

The display device DSP comprises a plate-like display panel PNL, an IC chip 2, and a flexible printed circuit board 3. The display panel PNL comprises a first substrate SUB1 and a second substrate SUB2. The second substrate SUB2 is opposed to the first substrate SUB1. A filling material may be supplied, a vacuum space may be formed, or a space of inert gas atmosphere may be formed, between the first substrate SUB1 and the second substrate SUB2.

The first substrate SUB1 comprises an organic EL element, which will be explained later, as a display element. In addition, the first substrate SUB1 comprises an insulating substrate 10 on a side opposite to the second substrate SUB2. The insulating substrate 10 comprises a first base 101, a second base 102, and a hydrogen trap layer 103 serving as a middle layer including a metal layer. Their details will be explained later but, in the example illustrated, the first base 101, the second base 102, and the hydrogen trap layer 103 are formed over an entire area of the X-Y plane, in the first substrate SUB1.

The second substrate SUB2 may be a sealing member which seals the organic EL element, a cover glass of an electronic device incorporating the display device DSP, or a film member such as a polarizer, a retardation film, or a transparent protective plate.

The display panel PNL includes a display area DA on which an image is displayed and a frame-shaped non-display area NDA surrounding the display area DA. The display area DA is composed of a plurality of pixels PX arrayed in a matrix. Each of the pixels PX may be composed of three types of sub-pixels such as a red pixel, a green pixel, and a blue pixel or may be composed of four or more types of sub-pixels composed of three sub-pixels mentioned above and a white pixel or the like. Each of the sub-pixels comprises the organic EL element. The non-display area NDA includes a mounting area MA where the IC chip 2 and the flexible printed circuit board 3 are mounted. The mounting area MA corresponds to an area which does not overlap the second substrate SUB2, in the first substrate SUB1. For example, the flexible printed circuit board 3 is mounted in the mounting area MA of the first substrate SUB1, and the IC chip 2 is mounted on the flexible printed circuit board 3. The embodiments are not limited to the example illustrated, but the IC chip 2 may be mounted in the mounting area MA. The IC chip 2 and the flexible printed circuit board 3 function as signal supply sources which supply signals necessary to drive the pixels PX. The hydrogen trap layer 103 is disposed over the entire area of the display area DA and the non-display area NDA. The hydrogen trap layer 103 overlaps the mounting area MA (or an area which does not overlap the second substrate SUB2).

Figure 2:
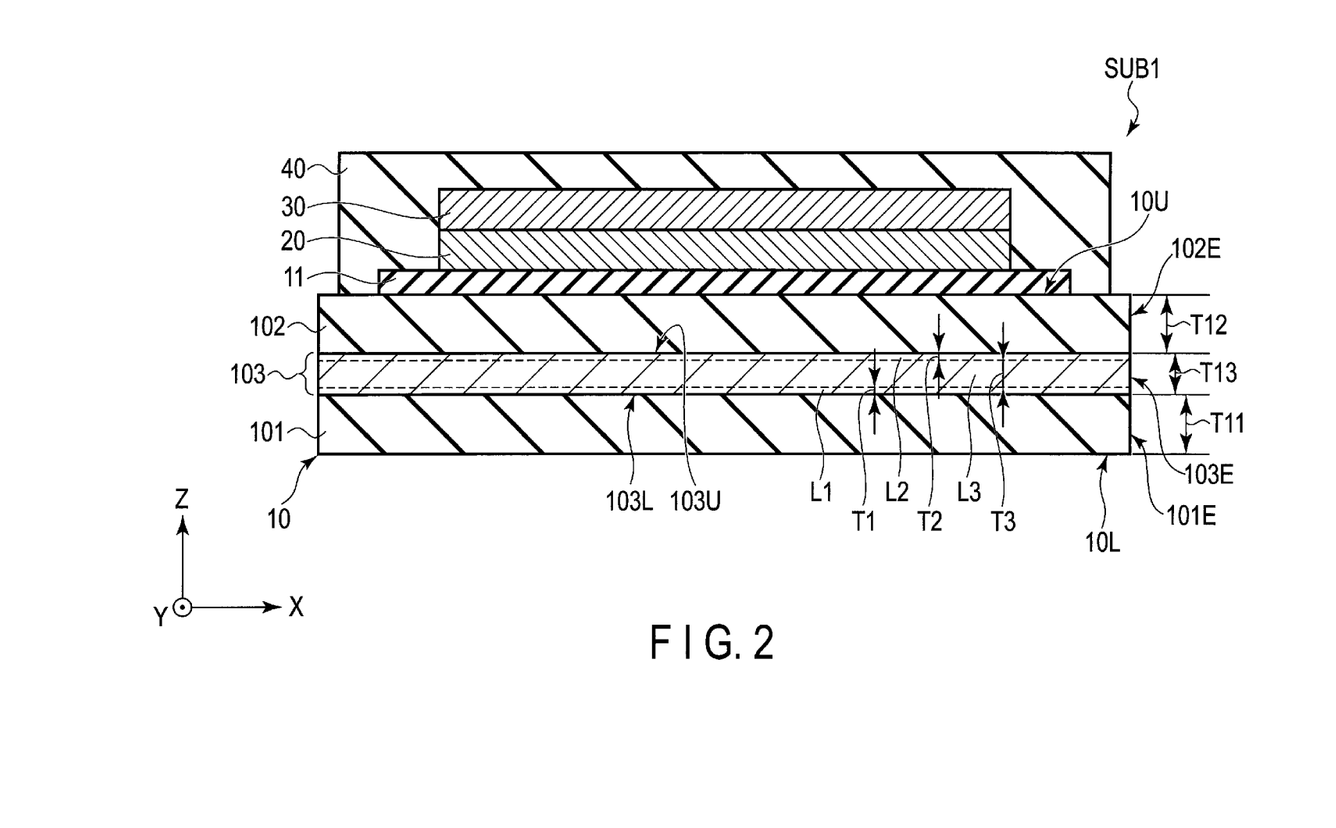
FIG. 2 is a cross-sectional view showing a configuration example of a first substrate SUB1 shown in FIG. 1.

FIG. 2 is a cross-sectional view showing a configuration example of the first substrate SUB1 shown in FIG. 1. Only main portions necessary for explanations are illustrated. The first substrate SUB1 comprises the insulating substrate 10, an undercoat layer 11, a circuit unit 20, a display element unit 30, a sealing film 40, and the like.

The insulating substrate 10 has an upper surface 10U and a lower surface 10L. In the insulating substrate 10, the second base 102 is located on an upper side of the first base 101. The lower surface 10L corresponds to a lower surface of the first base 101, and the upper surface 10U corresponds to an upper surface of the second base 102. The first base 101 and the second base 102 are resin substrates, which are formed of a resin material such as polyimide. In the embodiments, the first base 101 and the second base 102 are formed of polyimide baked at a high temperature of 350° C. or higher (for example, 500° C.) and have a high heat resistance property. The first base 101 and the second base 102 are opaque, for example, brown. An end portion 101E of the first base 101, an end portion 103E of the hydrogen trap layer 103, and an end portion 102E of the second base 102 are arranged in order in the third direction Z.

The hydrogen trap layer 103 is located between the first base 101 and the second base 102. The hydrogen trap layer 103 has an upper surface 103U and a lower surface 103L. In the example illustrated, the lower surface 103L is in contact with the first base 101, and the upper surface 103U is in contact with the second base 102. No adhesive is intervened between the first base 101 and the hydrogen trap layer 103, and between the second base 102 and the hydrogen trap layer 103. In other words, the insulating substrate 10 is composed of a multi-layered body including no adhesive between layers.

The hydrogen trap layer 103 overlaps the display element unit 30, an area where the undercoat layer 11 is in contact with the sealing film 40, and an area where the second base 102 is in contact with the sealing film 40. The hydrogen trap layer 103 has a function of occluding more hydrogen than the first base 101 and the second base 102, and traps hydrogen traveling from the first base 101 toward the second base 102. Diffusion of hydrogen to an upper side than the second base 102 (or the display element unit 30 side) can be thereby suppressed. For example, the hydrogen trap layer 103 is a metal layer of any one of titanium (Ti), palladium (Pd), zirconium (Zr), and aluminum (Al). The hydrogen trap layer 103 is opaque and has, for example, silver color.

The hydrogen trap layer 103 comprises a first layer L1 which is in contact with the first base 101, a second layer L2 which is in contact with the second base 102, and a third layer L3 which is located between the first layer L1 and the second layer L2 and which is in contact with both of the first layer L1 and the second layer L2. The end portion 103E is formed by the first layer L1, the second layer L2, and the third layer L3. The first layer L1 has the lower surface 103L. The second layer L2 has the upper surface 103U. The third layer L3 has a different composition from the first layer L1 and the second layer L2. For example, the nitrogen content of each of the first layer L1 and the second layer L2 is higher than that of the third layer L3. The hydrogen trap layer 103 is mainly formed of, for example, a single metal material. In other words, the first layer L1, the second layer L2, and the third layer L3 are metal layers of the same base. For example, the hydrogen trap layer 103 is a titanium-based metal layer, which is mainly formed of titanium. The first layer L1 and the second layer L2 are formed of nitrogen-doped titanium or a titanium nitride. The third layer L3 is a titanium layer and has a smaller nitrogen content than each of the first layer L1 and the second layer L2. The first layer L1 and the second layer L2 have a function of an oxidation prevention layer to prevent oxidation of the third layer L3.

A thickness T3 of the third layer L3 is larger than each of a thickness T1 of the first layer L1 and a thickness T2 of the second layer L2. For example, the thickness T3 is three to ten times as large as the thickness T1. For example, each of the thickness T1 and the thickness T2 is 10 nm and the thickness T3 is 50 nm. A thickness T13 of the hydrogen trap layer 103 is equivalent to a sum of the thickness T1, the thickness T2, and the thickness T3.

In addition, each of a thickness T11 of the first base 101 and a thickness T12 of the second base 102 is larger than the thickness T13 of the hydrogen trap layer 103. For example, the thickness T11 is one hundred or more times as large as the thickness T13. For example, each of the thickness T11 and the thickness T12 is 7 to 10 μm and the thickness T13 is 70 nm. The thickness indicates a distance in the third direction Z.

The upper surface 10U is covered with the undercoat layer 11. The undercoat layer 11 is formed of an inorganic material such as silicon nitride (SiN), silicon oxide (SiO) or silicon oxynitride (SiON) and is formed as a single-layer body or a multilayer body. The undercoat layer 11 has a barrier function of mainly suppressing entry of moisture into the display element unit 30.

The circuit unit 20 is formed on the undercoat layer 11. The circuit unit 20 comprises a drive circuit for driving the organic EL element, and the like, which will be explained later.

The display element unit 30 is formed on the circuit unit 20. The display element unit 30 comprises the organic EL element and the like, which will be explained later.

The display element unit 30 is covered with the sealing film 40. The sealing film 40 is transparent and allows light emitted from the display element unit 30 to be transmitted. The sealing film 40 desirably has a barrier function of suppressing entry of moisture into the display element unit 30. The sealing film 40 is in contact with the undercoat layer 11 outside the circuit unit 20. The sealing film 40 is in contact with the upper surface 10U outside the undercoat layer 11.

In the cross-section shown in FIG. 2, an area where the display element unit 30 is disposed corresponds to the display area DA shown in FIG. 1, and an area outside the display element unit 30 corresponds to the non-display area NDA shown in FIG. 1.

Figure 3:
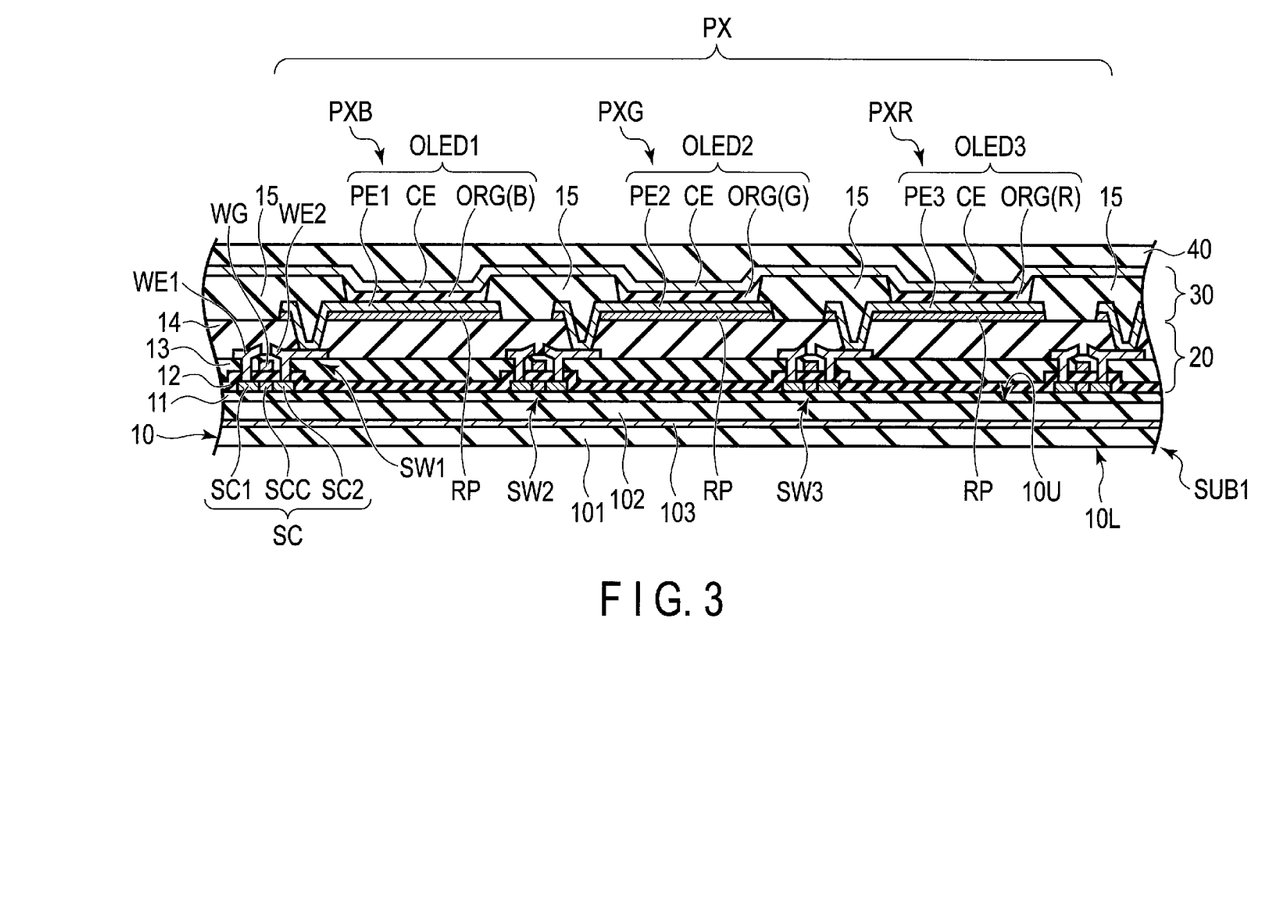
FIG. 3 is a cross-sectional view showing a structural example of the first substrate SUB1 shown in FIG. 2 in a display area DA.

FIG. 3 is a cross-sectional view showing a structural example of the first substrate SUB1 shown in FIG. 2 in a display area DA.

The first substrate SUB1 comprises a first insulating film 11, a second insulating film 12, a third insulating film 13, a fourth insulating film 14, a bank 15, switching elements SW1 to SW3, a reflector plate RP, organic EL elements OLED1 to OLED3, the sealing film 40, and the like, on the side of upper surface 10U of the insulating substrate 10. The first insulating film 11 corresponds to the undercoat layer shown in FIG. 2. The second insulating film 12, the third insulating film 13, the fourth insulating film 14, and the switching elements SW1 to SW3 are included in the circuit unit 20 shown in FIG. 2. The bank 15, the reflector plate RP, and organic EL elements OLED1 to OLED3 are included in the display element unit 30 shown in FIG. 2. In the example illustrated, the pixel PX comprises a blue pixel PXB displaying a blue color, a green pixel PXG displaying a green color, and a red pixel PXR displaying a red color.

The switching elements SW1 to SW3 are formed on the first insulating film 11. The switching element SW1 is disposed in the blue pixel PXB, the switching element SW2 is disposed in the green pixel PXG, and the switching element SW3 is disposed in the red pixel PXR. Each of the switching elements SW1 to SW3 is, for example, a thin-film transistor (TFT) comprising a semiconductor layer SC. The switching elements SW1 to SW3 have the same structure, and the structure of the switching element SW1 will be explained below in more detail.

In the example illustrated, the switching element SW1 is a top-gate switching element, which comprises the semiconductor layer SC formed of polycrystalline silicon (p-Si). The semiconductor layer SC may be formed of amorphous silicon (a-Si), an oxide semiconductor, or the like. Alternatively, the switching element SW1 may be a bottom-gate switching element.

The semiconductor layer SC includes a channel area SCC, and impurity areas SC1 and SC2 containing more impurities than the channel area SCC. The channel area SCC is located between the impurity areas SC1 and SC2. In addition, the channel area SCC corresponds to an area having a higher resistance than the impurity areas SC1 and SC2. The semiconductor layer SC is formed on the first insulating film 11, and is covered with the second insulating film 12. The second insulating film 12 is also disposed on the first insulating film 11. The second insulating film 12 is formed of an inorganic material such as silicon oxide.

A gate electrode WG is formed on the second insulating film 12 and located just above the channel area SCC. The gate electrode WG is formed of metal materials such as molybdenum (Mo), tungsten (W), aluminum (Al), titanium (Ti), and copper (Cu) or alloys containing these metal materials, for example, molybdenum tungsten (MoW). The gate electrode WG is covered with the third insulating film 13. The third insulating film 13 is also disposed on the second insulating film 12. The third insulating film 13 is formed of an inorganic material such as silicon nitride or silicon oxide.

A first electrode WE1 and a second electrode WE2 are formed on the third insulating film 13. The first electrode WE1 is electrically connected to the impurity area SC1, and the second electrode WE2 is electrically connected to the impurity area SC2. The first electrode WE1 and the second electrode WE2 are formed of metal materials such as molybdenum (Mo), tungsten (W), aluminum (Al), titanium (Ti), and copper (Cu) or alloys containing these metal materials, for example, a stacked layer body of aluminum and titanium. The first electrode WE1 and the second electrode WE2 are covered with the fourth insulating film 14. The fourth insulating film 14 is also disposed on the third insulating film 13. The fourth insulating film 14 is formed of, for example, a resin material such as acrylic resin.

The organic EL elements OLED1 to OLED3 are formed on the fourth insulating film 14. The organic EL element OLED1 is disposed in the blue pixel PXB and electrically connected to the switching element SW1. The organic EL element OLED2 is disposed in the green pixel PXG and electrically connected to the switching element SW2. The organic EL element OLED3 is disposed in the red pixel PXR and electrically connected to the switching element SW3. The organic EL elements OLED1 to OLED3 are top-emission type spontaneous light-emitting elements that emit light toward the sealing film 40 side, and emit light of different colors.

The bank 15 is formed on the fourth insulating film 14 to section the organic EL elements OLED1 to OLED3. The bank 15 is not explained in detail, but is formed in, for example, a grating shape or stripe shape on the fourth insulating film 14.

The organic EL element OLED1 comprises a pixel electrode PE1, the common electrode CE opposed to the pixel electrode PE1, and an organic emitting layer ORG(B) disposed between the pixel electrode PE1 and the common electrode CE. The organic EL element OLED2 comprises a pixel electrode PE2, the common electrode CE opposed to the pixel electrode PE2, and an organic emitting layer ORG(G) disposed between the pixel electrode PE2 and the common electrode CE. The organic EL element OLED3 comprises a pixel electrode PE3, the common electrode CE opposed to the pixel electrode PE3, and an organic emitting layer ORG(R) disposed between the pixel electrode PE3 and the common electrode CE.

The pixel electrode PE1 is electrically connected to the switching element SW1. The pixel electrode PE2 is electrically connected to the switching element SW2. The pixel electrode PE3 is electrically connected to the switching element SW3. Edges of each of the pixel electrodes PE1 to PE3 are covered with the banks 15. The pixel electrodes PE1 to PE3 are formed of, for example, a transparent conductive material such as Indium-Tin-Oxide (ITO) or Indium-Zinc-Oxide (IZO).

The reflector plates RP are disposed between the insulating substrate 10 and the pixel electrodes PE1 to PE3. In the example illustrated, the reflector plates RP are formed on the fourth insulating film 14 and overlap the pixel electrodes PE1 to PE3, respectively. The reflector plates RP are formed of, for example, a high-reflectivity metal material such as aluminum (Al), magnesium (Mg), silver (Ag) or titanium (Ti). The reflector plates RP may be disposed at any positions between the insulating substrate 10 and the pixel electrodes PE1 to PE3, but are desirably disposed at positions more close to the pixel electrodes PE1 to PE3 to prevent operation errors and the like of the switching elements SW1 to SW3 by the light emitted from the organic EL elements OLED1 to OLED3 reaching the switching elements SW1 to SW3 and, more desirably, disposed to cover the switching elements SW1 to SW3. Alternatively, an insulating layer may be intervened between the reflector plates RP and the pixel electrodes PE1 to PE3. In the example illustrated, the reflector plates RP and the pixel electrodes PE1 to PE3 are formed in different patterning steps, but their formation is not limited to this example. For example, the reflector plates RP and the pixel electrodes PE1 to PE3 may be formed in the single patterning step after laminating conductive layers. For example, the reflector plates RP and the pixel electrodes PE1 to PE3 may be formed of a three-layer laminate of ITO/Ag/ITO, IZO/Ag/IZO or the like.

The organic emitting layer ORG(B) contains a dopant material which emits blue light. The organic emitting layer ORG(G) contains a dopant material which emits green light. The organic emitting layer ORG(R) contains a dopant material which emits red light. The organic emitting layer ORG(B), the organic emitting layer ORG(G), and the organic emitting layer ORG(R) are cut on the banks 15.

The common electrode CE is formed sequentially across the organic EL elements OLED1 to OLED3 without interruption and also covers the banks 15 exposed from the organic emitting layers. The common electrode CE is formed of, for example, a transparent conductive material such as ITO or IZO. Alternatively, the common electrode CE may be formed as a semitransparent film such as magnesium (Mg) or silver (Ag).

In the organic EL elements OLED1 to OLED3, a hole injection layer, a hole transport layer, or the like may be further intervened between the pixel electrodes PE1 to PE3, and the organic emitting layers ORG(B), ORG(G), ORG(R), or an electron-injection layer, an electron-transport layer, or the like may be further intervened between the organic emitting layers ORG(B), ORG(G), ORG(R), and the common electrode CE.

The sealing film 40 seals the organic EL elements OLED1 to OLED3. The sealing film 40 protects the organic EL elements OLED1 to OLED3 from moisture, oxygen, and the like. The sealing film 40 is formed of, for example, a stacked layer body obtained by alternately stacking inorganic thin films formed of an inorganic material and organic thin films formed of an organic material.

In the display device DSP, when each of the organic EL elements OLED1 to OLED3 emits light, the light is emitted to the outside through the sealing film 40. Blue light is emitted from the organic EL element OLED1 in the blue pixel PXB, green light is emitted from the organic EL element OLED2 in the green pixel PXG, and red light is emitted from the organic EL element OLED3 in the red pixel PXR. Color display is thereby implemented.

The first substrate SUB1 is not limited to the above-explained structural example. For example, if the pixel PX further comprises a white pixel as a sub-pixel, the white pixel may comprise an organic EL element which includes an organic layer emitting white light or may be configured to comprise three organic EL elements OLED1 to OLED3 explained above. Alternatively, an organic emitting layer formed sequentially across the organic EL elements OLED1 to OLED3 without interruption to emit white light may be employed as the first substrate SUB1. On the first substrate SUB1, color display can be implemented by combining color filters opposed to the organic EL elements OLED1 to OLED3.

Next, a method of manufacturing the above-explained display device DSP will be explained with reference to FIG. 4.

Figure 4:
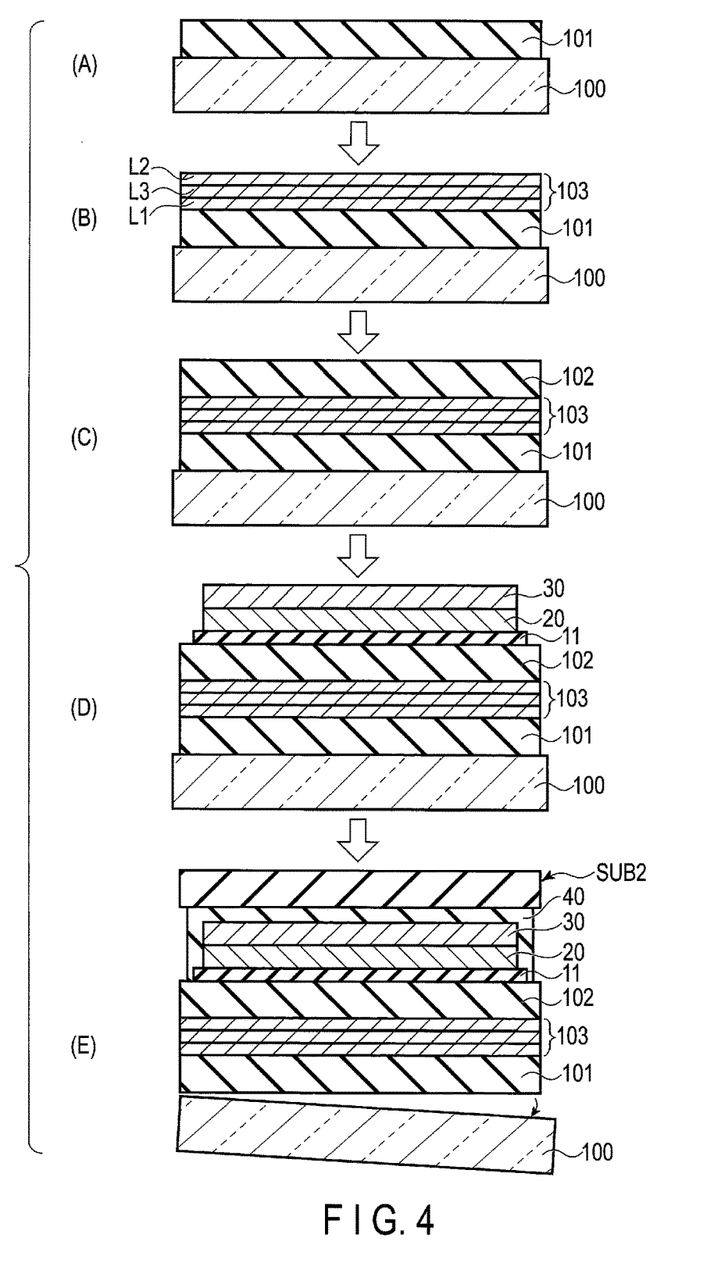
FIG. 4 is a view for explanation of a method of manufacturing the display device DSP according to the embodiments.

First, as shown in FIG. 4(A), polyimide is applied in a varnish state onto a support substrate 100 and dried and then, the first base 101 is formed by baking a polyimide layer. The baking temperature of the polyimide layer is desirably 350° C. or higher, for example, 500° C.

Next, as shown in FIG. 4(B), the hydrogen trap layer 103 is formed on the first base 101. In steps of forming the hydrogen trap layer 103, for example, a titanium layer is formed by spattering. More specifically, the first layer L1 containing nitrogen is formed by adding nitrogen gas when forming the titanium film onto the first base 101, as the first step. Then, the third layer L3 containing a smaller nitrogen content than the first layer L1 is formed by forming the titanium film without adding nitrogen gas, as the second step. The second layer L2 containing nitrogen is formed by adding nitrogen gas when forming the titanium film, as the third step. In other words, when forming the hydrogen trap layer 103, the first layer L1 having a high nitrogen content is formed under the third layer L3 and the second layer L2 having a high nitrogen content is formed on the third layer L3, by adding nitrogen gas in the first and third steps while sequentially forming the titanium film through the first to third steps.

As shown in FIG. 4(C), polyimide is applied in a varnish state onto the hydrogen trap layer 103 and dried, the polyimide layer is baked, and the second base 102 is thereby formed. The baking temperature of the polyimide layer is desirably 350° C. or higher, for example, 500° C. When forming the second base 102, baking is executed in oxygen atmosphere and oxidation of the hydrogen trap layer 103 can be suppressed. In other words, the first layer L1 and the second layer L2 which are nitrogen-doped titanium layers function as oxidation preventing layers, and the first layer L1 and the second layer L2 sandwich the third layer L3. For this reason, oxidation of the third layer L3 can be suppressed and degradation of the hydrogen trapping performance can be suppressed in the baking step in oxygen atmosphere.

Next, as shown in FIG. 4(D), the undercoat layer 11 is formed on the second base 102, the circuit unit 20 is formed on the undercoat layer 11, and the display element unit 30 is formed on the circuit unit 20. The steps of forming the circuit unit 20 include, for example, the steps of forming the semiconductor layer SC on the undercoat layer 11, forming the second insulating layer 12, forming the gate electrode WG, forming the third insulating film 13, forming the first electrode WE1 and the second electrode WE2, the fourth insulating layer 14, and the like as shown in FIG. 3. The steps of forming the display element unit 30 include, for example, the steps of forming the reflector plates RP on the fourth insulating film 14, forming the pixel electrodes PE1 to PE3, forming the banks 15, forming the organic emitting layer ORG, forming the common electrode CE, and the like as shown in FIG. 3. The first substrate SUB1 is thereby manufactured.

Next, as shown in FIG. 4(E), the sealing film 40 is formed and then the second substrate SUB2 is bonded on the sealing film 40. After that, the support substrate 100 is peeled off from the first base 101. Manners such as laser ablation and thermal rapid annealing can be employed as the manner of peeling off the support substrate 100 from the first base 101, but the manner is not limited to these manners. The display device DSP is thereby manufactured.

According to the embodiments, the insulating substrate 10 comprises the hydrogen trap layer 103 between the first base 101 and the second base 102. For this reason, hydrogen traveling from the first base 101 toward the second base 102 can be reduced, and diffusion of hydrogen toward the semiconductor layer SC located on the second base 102 can be suppressed. Therefore, variation in the transistor characteristics in the switching element SW can be suppressed and the degradation in reliability can be suppressed.

In addition, the hydrogen trap layer 103 comprises the third layer L3 between the first layer L1 which is in contact with the first base 101 and the second layer L2 which is in contact with the second base 102, and the nitrogen content of each of the first layer L1 and the second layer L2 is higher than the nitrogen content of the third layer L3. For this reason, oxidation of the third layer L3 can be suppressed and degradation of the hydrogen trapping performance can be suppressed in the baking step in formation of the second base 102.

Furthermore, the insulating substrate 10 comprises the metal layer corresponding to the hydrogen trap layer 103. For this reason, charging of the insulating substrate 10 can be suppressed and reduction in manufacturing yields caused by break and short circuit due to electrostatic discharge can be suppressed in the process of manufacturing the display device DSP.

In addition, the embodiments may comprise silicon oxide, or a three-layer structure of silicon oxide, silicon nitride, and silicon oxide, between the first base 101 and the first layer L1. Similarly, the embodiments may comprise silicon oxide, or a three-layer structure of silicon oxide, silicon nitride, and silicon oxide, between the second base 102 and the second layer L2.

Next, the hydrogen trapping performance of the hydrogen trap layer 103 of the embodiments will be explained. The present inventor conducted comparative experiment 1 explained below to verify the hydrogen trapping effect obtained by providing the hydrogen trap layer 103.

Figure 5:
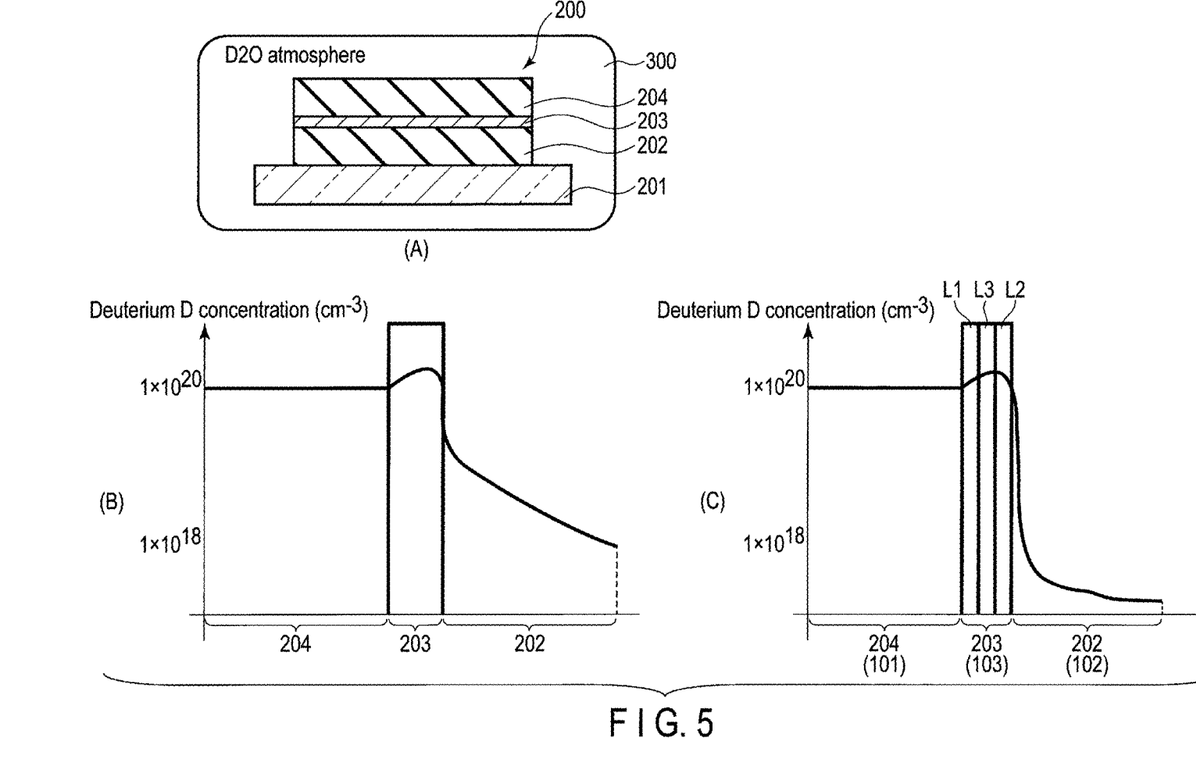
FIG. 5 is a graph for explanation of comparative experiment 1.

FIG. 5(A) is a view for explanation of a summary of comparative experiment 1. In comparative experiment 1, sample 200 was left in deuterium atmosphere for three days and a deuterium concentration in each layer of the sample was measured. First, the sample 200 obtained by forming a polyimide layer 202, a middle layer 203, and a polyimide layer 204 in order on a support substrate 201 was prepared. The sample 200 was set in an airtight chamber 300 in which heavy water was dropped. The inside of the chamber 300 was set to conditions of the temperature at 85° C. and the relative humidity of 85%. After the sample 200 set in the chamber 300 was left for three days, the deuterium concentration was measured.

FIG. 5(B) is a graph showing the measurement result of the deuterium concentration in the sample 200 to be compared. In the sample 200 to be compared, the middle layer 203 was formed of a silicon oxide ($SiO_2$), and the polyimide layers 202 and 204 were formed in the steps shown in FIG. 4(A) and FIG. 4(C). In the measurement result shown in the graphs, the horizontal axis represents a position of the sample 200 in the thickness direction and the vertical axis represents the deuterium concentration. The deuterium concentration of the polyimide layer 202 is lower than the deuterium concentration of the polyimide layer 204 most exposed in the atmosphere but is at an extremely high level.

FIG. 5(C) is a graph showing the measurement result of the deuterium concentration in the sample 200 corresponding to the embodiments. In the sample 200 corresponding to the embodiments, the polyimide layer 204 corresponds to the first base 101, the polyimide layer 202 corresponds to the second base 102, and the middle layer 203 corresponds to the hydrogen trap layer 103. The middle layer 203 includes a first layer L1, a third layer L3, and a second layer L2. According to the measurement result shown in the graph, the deuterium concentration of the polyimide layer 202 was at an extremely lower level than the sample to be compared. It was thereby confirmed that the hydrogen trap layer 103 of the embodiments has a higher hydrogen trapping performance than the middle layer 203 of the silicon oxide and diffusion of hydrogen from the polyimide layer 204 toward the polyimide layer 202 can be suppressed.

Next, the influence of the transistor characteristics resulting from the diffusion of hydrogen will be explained. In a first stage (ini) in which hydrogen does not diffuse to the semiconductor layer, in the switching element, a threshold value of a gate voltage at which the current starts flowing to the switching element is a predetermined value. In a second stage (mid) in which hydrogen starts diffusing to the semiconductor layer, the threshold value tends to be lowered since the carriers increase. In a third stage (final) in which hydrogen further diffuses to the semiconductor layer, the threshold value tends to be increased since an interface between the semiconductor layer and the insulating layer is degraded due to the influence of hydrogen. Thus, the threshold value of the gate voltage is varied due to the diffusion of hydrogen to the semiconductor layer. If the equivalent gate voltage is applied, the current flowing through the switching element is varied.

The present inventor conducted comparative experiment 2 explained below to verify the stability of the transistor characteristics obtained by providing the hydrogen trap layer 103 of the embodiments. In comparative experiment 2, samples obtained by forming the switching element SW1 comprising the semiconductor layer SC on the insulating substrate 10 as shown in FIG. 3 were prepared and, as explained with reference to FIG. 5(A), the samples were left in deuterium atmosphere for three days and the threshold value of the switching element SW1 was measured.

Figure 6:
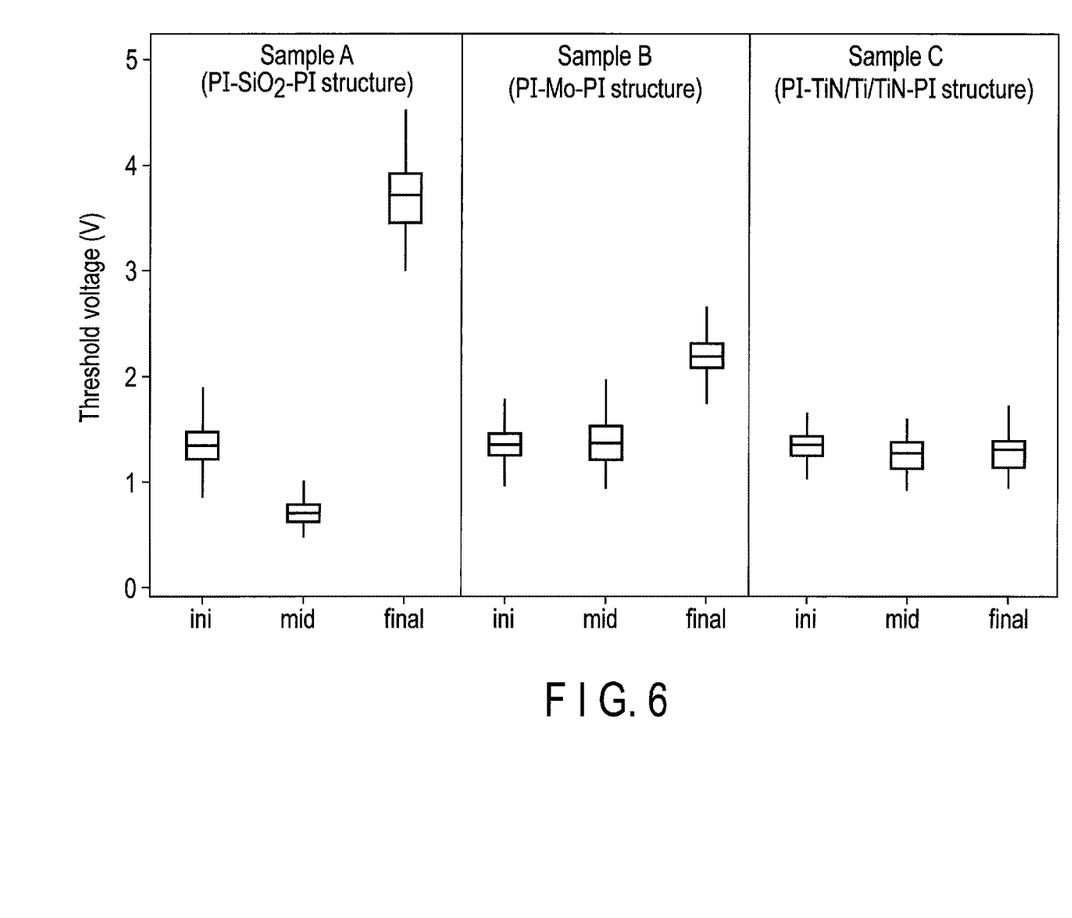
FIG. 6 is a graph showing a measurement result of the threshold value in comparative experiment 2.

FIG. 6 is a graph showing a measurement result of the threshold value in comparative experiment 2.

In sample A to be compared, each of the first base 101 and the second base 102 of the insulating substrate 10 was a polyimide layer, and the middle layer 203 of silicon oxide ($SiO_2$) was arranged between the first base 101 and the second base 102 instead of the hydrogen trap layer 103. As shown in the graph, the threshold value was more lowered in the second stage (mid) than in the first stage (ini) and then remarkably increased in the third stage (final).

In sample B to be compared, each of the first base 101 and the second base 102 was a polyimide layer, and the middle layer 203 of molybdenum (Mo) was arranged instead of the hydrogen trap layer 103. The tendency that the threshold value is not largely varied through the first stage and the second stage but largely varied in the second stage and increased in the third stage as shown in the graph was confirmed.

Sample C corresponds to the embodiments and, each of the first base 101 and the second base 102 of the insulating substrate 10 was a polyimide layer, and the titanium-based hydrogen trap layer 103 was arranged between the first base 101 and the second base 102. It was confirmed that the threshold value was hardly varied through the first stage, the second stage, and the third stage as shown in the graph. According to the embodiments, the transistor characteristics can be maintained as the state in the first stage by providing the hydrogen trap layer 103. The decrease in reliability can be therefore suppressed.

Next, the present inventor conducted comparative experiment 3 explained below to verify the oxidation prevention effect of the titanium layer obtained by employing the stacked layer body formed by sandwiching the titanium layer between the nitrogen-doped titanium layers as the hydrogen trap layer 103. In comparative experiment 3, as explained with reference to FIG. 5(A), the sample 200 obtained by forming the polyimide layer 202, the middle layer 203, and the polyimide layer 204 in order on the support substrate 201 was prepared and the oxygen concentration in each of the layers was measured.

Figure 7:
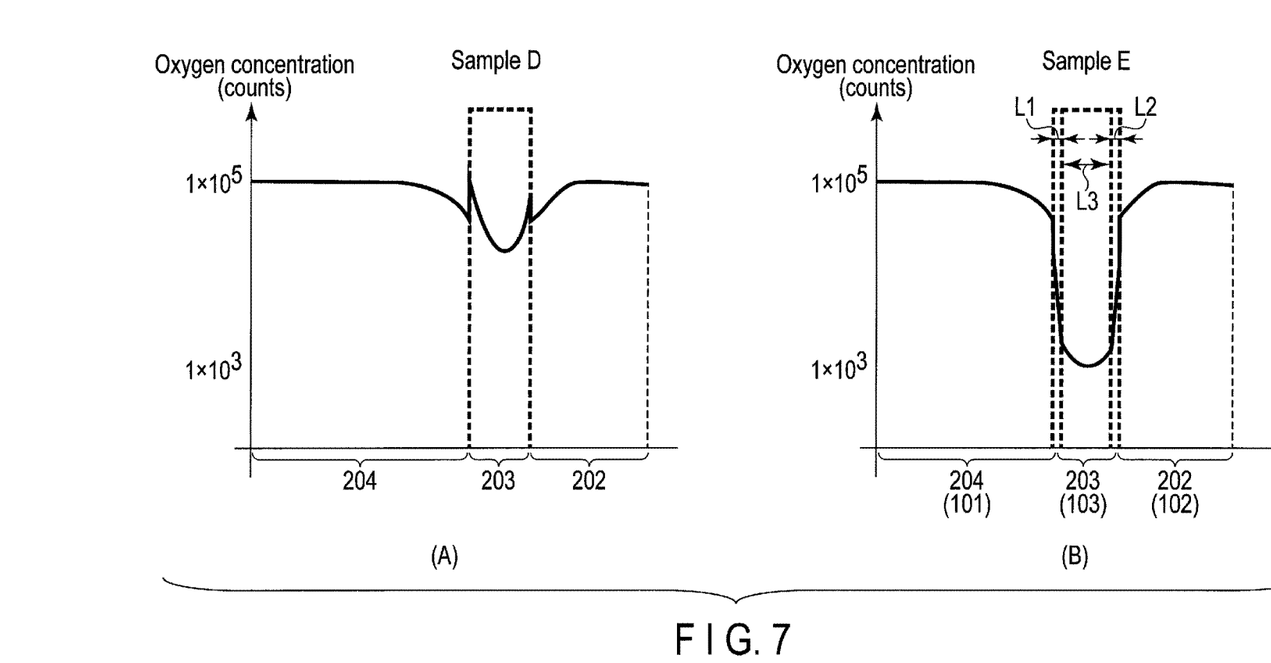
FIG. 7 depicts graphs showing measurement results of the oxygen concentrations in comparative experiment 3.

FIG. 7 depicts graphs showing measurement results of the oxygen concentrations in comparative experiment 3.

FIG. 7(A) is a graph showing the measurement result of the oxygen concentration in sample D to be compared. In sample D to be compared, the middle layer 203 was a single-layer body formed of titanium, and the polyimide layers 202 and 204 were formed in the baking steps shown in FIG. 4(A) and FIG. 4(C). In the measurement result shown in the graph, the horizontal axis represents a position of sample D in the thickness direction and the vertical axis represents the oxygen concentration. The middle layer 203 had a high oxygen concentration throughout the entire body of the layer. Furthermore, it was confirmed that the middle layer 203 had a high oxygen concentration at positions close to interfaces between the layer and the polyimide layers 202 and 204 and oxidation was proceeding.

FIG. 7(B) is a graph showing the measurement result of the oxygen concentration in sample E corresponding to the embodiments. In sample E, the polyimide layer 204 corresponds to the first base 101, the polyimide layer 202 corresponds to the second base 102, and the middle layer 203 corresponds to the hydrogen trap layer 103. The middle layer 203 included a first layer L1 (nitrogen-doped titanium layer), a third layer L3 (titanium layer), and a second layer L2 (nitrogen-doped titanium layer). According to the measurement result shown in the graph, the oxygen concentration of the middle layer 203 was lower than that of sample D to be compared. Furthermore, it was confirmed that the oxygen concentration in the third layer L3 was extremely low. It was thereby confirmed that the hydrogen trap layer 103 of the embodiments has a higher oxidation prevention effect than the single titanium layer and can maintain the hydrogen trapping performance.

Figure 8:
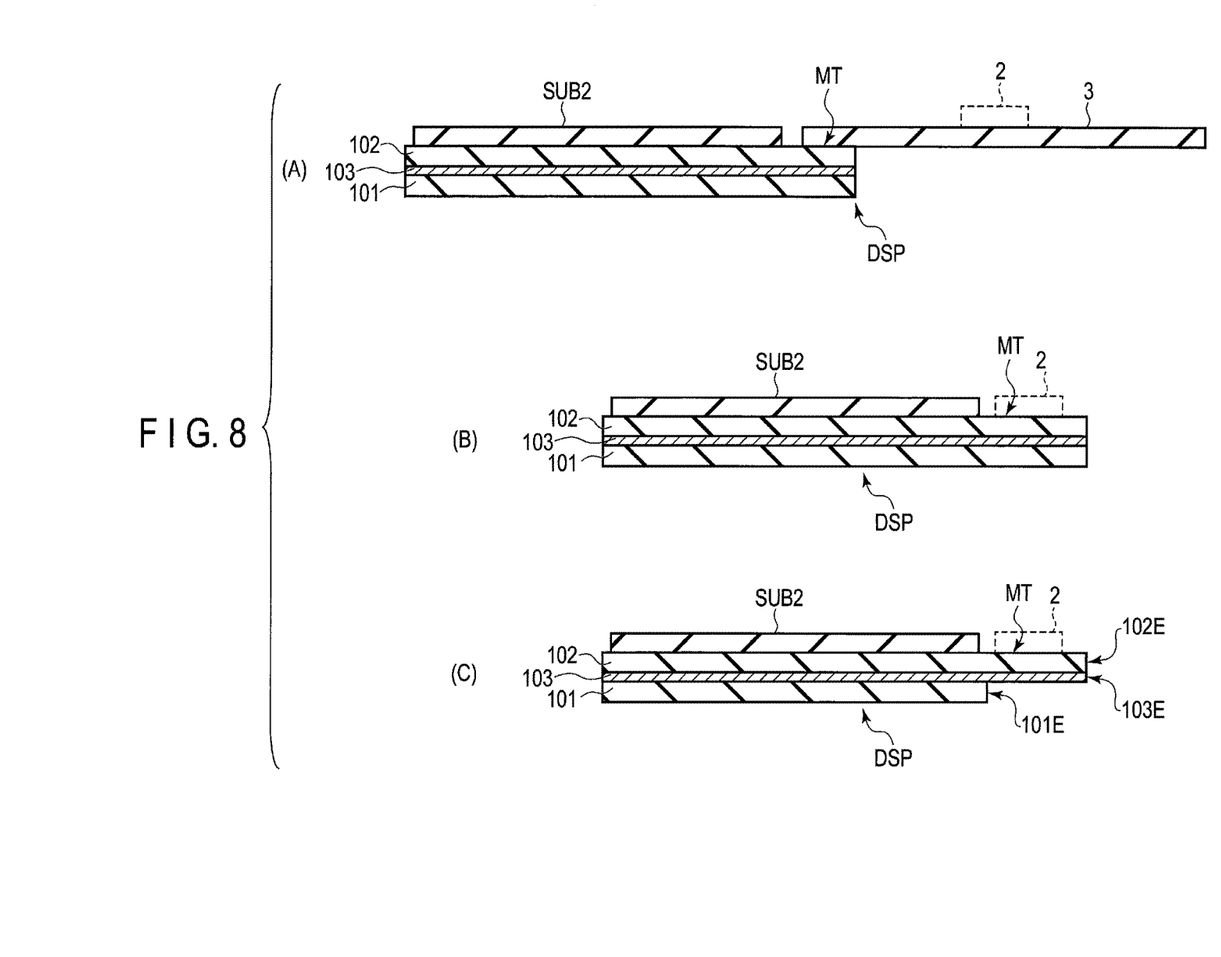
FIG. 8 is a cross-sectional view showing display devices of various embodiments.

FIG. 8 is a cross-sectional view showing display devices of various embodiments.

A display device DSP shown in FIG. 8(A) comprises a first base 101, a second base 102, a hydrogen trap layer 103 serving as a middle layer including a metal layer, a second substrate SUB2, an IC chip 2, and a flexible printed circuit board 3. The second base 102 comprises a mounting portion MT which protrudes further to the outside than the second substrate SUB2. The flexible printed circuit board 3 is connected to the mounting portion MT. The IC chip 2 is connected to the flexible printed circuit board 3.

In a display device DSP shown in FIG. 8(B), an IC chip 2 is directly connected to a mounting portion MT of a second base 102. A flexible printed circuit board 3 is unnecessary in the display device DSP shown in FIG. 8(B) as compared with the display device DSP shown in FIG. 8(A).

In a display device DSP shown in FIG. 8(C), a first base 101 is cut away on a back surface side of a mounting portion MT to which an IC chip 2 is connected, as compared with the display device DSP shown in FIG. 8(B). In other words, an end portion 101E of the first base 101 is located on an inner side than an end portion 102E of a second base 102 and an end portion 103E of a hydrogen trap layer 103. The display device DSP shown in FIG. 8(C) has an advantage that the mounting portion MT comprising the IC chip 2 can easily be bent downwardly by cutting the first base 101, as compared with the display device DSP shown in FIG. 8(B).

As explained above, a display device and a manufacturing method capable of suppressing the reduction in reliability can be provided by the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the above-explained embodiments, an organic EL display device is explained as an example of the display device but may be a liquid crystal display device comprising a liquid crystal element as the display element. Since the display device DSP of the embodiments employs the opaque insulating substrate 10, a reflective liquid crystal display device displaying an image by selectively reflecting external light incident via the second substrate SUB2 is desirable as the liquid crystal display device.

In addition, since the hydrogen trap layer 103 suppresses the variation in the transistor characteristics of the switch element by suppressing the diffusion of hydrogen to the semiconductor layer, the hydrogen trap layer 103 may be disposed just under at least the semiconductor layer SC of the insulating substrate 10. In other words, the hydrogen trap layer 103 may not be disposed on the entire surface of the first substrate SUB1, but may be disposed just under the display area and the drive circuit equipped with the switching circuit.

What is claimed is:
1. A display device, comprising:
a first base;
a second base;
a middle layer including a metal layer located between the first base and the second base; and
a circuit unit and a display element unit located above the second base,
wherein
the metal layer is formed of any one of titanium (Ti), palladium (Pd), zirconium (Zr), and aluminum (Al),
the middle layer comprises a first layer which is in contact with the first base, a second layer which is in contact with the second base, and a third layer which is in contact with the first layer and the second layer, and a nitrogen content of each of the first layer and the second layer is higher than a nitrogen content of the third layer.

2. The display device of claim 1, wherein the middle layer is untransparent.

3. The display device of claim 1, wherein a thickness of the third layer is larger than a thickness of each of the first layer and the second layer.

4. The display device of claim 3, wherein the thickness of the third layer is three or more times and ten or less times as large as the thickness of each of the first layer and the second layer.

5. The display device of claim 4, further comprising:
a sealing film covering the display element unit,
wherein
the display element unit comprises a top-emission type organic electroluminescence element emitting light toward a side of the sealing film.

6. The display device of claim 1, wherein each of the first base and the second base is formed of a resin material.

7. The display device of claim 6, wherein each of the first base and the second base is untransparent.

8. The display device of claim 7, wherein a thickness of each of the first base and the second base is larger than a thickness of the middle layer.

9. The display device of claim 8, wherein the thickness of each of the first base and the second base is one hundred or more times as large as the thickness of the middle layer.

10. The display device of claim 1, further comprising:
an undercoat layer located between the second base and the circuit unit; and
a sealing film covering the display element unit,
wherein
the middle layer overlaps the display element unit, and also overlaps an area where the undercoat layer is in contact with the sealing film.

11. The display device of claim 10, wherein the middle layer overlaps an area where the second base is in contact with the sealing film.

12. The display device of claim 1, wherein an adhesive is not intervened between the middle layer and the first base and between the middle layer and the second base.

13. The display device of claim 1, further comprising:
a mounting area where printed circuit board is mounted,
wherein
the middle layer overlaps the mounting area.

14. A method of manufacturing a display device, the method comprising:
applying polyimide in a varnish state on a support substrate, baking polyimide, and forming a first base;
forming a middle layer including a metal layer on the first base;
applying polyimide in a varnish state on the middle layer, baking polyimide, and forming a second base; and
forming a circuit unit and a display element unit on the second base,
wherein
the forming the middle layer comprises:
a first step of forming a first layer including nitrogen on the first base;
a second step of forming a third layer having a smaller nitrogen content than the first layer, on the first layer, subsequently to the first step; and
a third step of forming a second layer including nitrogen, on the third layer, subsequently to the second step.

15. The method of claim 14, further comprising:
sequentially forming a titanium film through the first to third steps;
adding nitrogen gas and forming the titanium film, in the first and third steps; and
forming the titanium film without adding nitrogen gas, in the second step.

16. The method of claim 14, wherein the baking the polyimide is executed at a temperature higher than or equal to 350° C.

17. The method of claim 16, further comprising:
peeling off the support substrate from the first base after the display element unit is formed.

* * * * *